United States Patent [19]

Hamada

[11] Patent Number: 5,278,465
[45] Date of Patent: Jan. 11, 1994

[54] SEMICONDUCTOR INTEGRATED CIRCUIT DEVICE HAVING ECL GATE GROUP CIRCUITS AND GATE VOLTAGE CONTROL CIRCUITS

[75] Inventor: Mitsuhiro Hamada, Tokyo, Japan

[73] Assignee: NEC Corporation, Tokyo, Japan

[21] Appl. No.: 788,579

[22] Filed: Nov. 6, 1991

[30] Foreign Application Priority Data

Nov. 6, 1990 [JP] Japan ................... 2-301866

[51] Int. Cl.⁵ .................. H03K 19/086; H03K 19/173
[52] U.S. Cl. ..................... 307/467; 307/455; 307/296.3; 307/465
[58] Field of Search ............... 307/465, 466, 467, 468, 307/469, 296.3, 451, 455

[56] References Cited

U.S. PATENT DOCUMENTS

| | | | |
|---|---|---|---|
| 4,645,953 | 2/1987 | Wong | 307/465 |
| 4,713,560 | 12/1987 | Herndon | 307/296.3 |
| 5,128,558 | 7/1992 | Ovens et al. | 307/465 |
| 5,138,198 | 8/1992 | Shen et al. | 307/296.3 |

FOREIGN PATENT DOCUMENTS

| | | |
|---|---|---|
| 61-43829 | 3/1986 | Japan. |
| 61-80586 | 4/1986 | Japan. |
| 62-100019 | 5/1987 | Japan. |
| 63-126316 | 5/1988 | Japan. |

*Primary Examiner*—Edward P. Westin
*Assistant Examiner*—Richard Roseen

[57] ABSTRACT

A semiconductor integrated circuit device includes a plurality of ECL gate groups. Each gate group includes a plurality of ECL gates each having a constant current source formed by a MOS transistor circuit. Each gate group also includes one gate voltage control circuit. When the gate voltage control circuit receives a signal indicating a selection state for the group, it applies a high potential bias voltage to the MOS transistor circuits of all the ECL gates within the gate group. On the other hand, when it receives a signal indicating a non-selection state, it applies a low potential bias voltage (GND potential) to them, thereby lowering the constant current to the minimum necessary amount. The circuit is capable of largely saving the current consumption by controlling the bias voltage for the MOS transistor circuits in two steps depending on the selection state or the non-selection state.

5 Claims, 6 Drawing Sheets

SEMICONDUCTOR INTEGRATED CIRCUIT DEVICE HAVING ECL GATE GROUP CIRCUITS AND GATE VOLTAGE CONTROL CIRCUITS

BACKGROUND OF THE INVENTION

1. Field of the Invention

The present invention relates to a semiconductor integrated circuit device and, more particularly, to a semiconductor integrated circuit device having an ECL wired-OR circuit, constituted by a BiCMOS circuit.

2. Description of the Prior Art

An ECL circuit ("Emitter Coupled Logic" circuit) has a smaller logical amplitude, about 800 mV ~ 1,600 mV, as compared with that of a CMOS circuit since in such ECL circuit a pair of bipolar transistors whose emitters are commonly connected operate as a differential amplifier. Due to the operation of small logical amplitude, a delay caused by wiring resistance and wiring capacitance is small, so that such ECL circuit is widely adopted in a semiconductor integrated circuit device which requires super high speed operation.

FIG. 8 shows a basic circuit of such ECL circuit. The ECL basic circuit shown in FIG. 8 comprises two stages. The first stage is a differential amplifier stage DA that is composed of a bipolar transistor Q10 which receives at its base an input signal from a terminal A, a bipolar transistor Q20 which receives at its base a reference voltage VR10 whose threshold level is set at a mid-point between a high level and a low level of the input signal, and a constant current circuit CS10 which is formed by a bipolar transistor Q30 and a resistor R30. The second stage is an emitter follower stage EF that is composed of bipolar transistors Q40 and Q50, which receive signals from load resistors R10 and R20 in the differential amplifier stage DA, and a constant current circuit CS20 which is formed by bipolar transistors Q60, Q70 and resistors R40, R50. One output terminal $\overline{A'}$ is connected to the emitter of the transistor Q40 and the other output terminal A' is connected to the emitter of the transistor Q50.

Signals which are in phase and in opposite phase with respect to the input signal are forwarded out from the output terminals A' and $\overline{A'}$, respectively, to the succeeding stage. The constant current circuit CS20 in the emitter follower stage EF operates to discharge the load capacitance connected parasitically to the output terminals A' and $\overline{A'}$ and to cause the output terminal A' or $\overline{A'}$ to change from its high potential to its low potential. The value of constant current which flows in the constant current circuit CS20 in the emitter-follower stage EF is generally in the range of about 0.2 mA ~ 0.6 mA although it depends on the value of load capacitance.

FIG. 1 shows an example wherein the above described ECL circuit is embodied in a semiconductor memory and a decoder circuit outputs sixteen decoder signals on the basis of four address input signals. In FIG. 1, an address buffer a, which is composed of an ECL circuit, receives such as an address input signal X0 and outputs such as signals X0' and $\overline{X0'}$ of in phase and in opposite phase with respect to the input signal X0, respectively. The bipolar transistors Q3 and Q4 are of multi-emitter configuration. The bipolar transistor Q3 supplies the opposite phase signal $\overline{X0'}$ with respect to the input signal X0 to signal lines 1 and 2, and the bipolar transistor Q4 supplies the in-phase signal X0' with respect to the input signal X0 to signal lines 3 and 4.

Likewise, also from another address buffer a, from which another address signal X1 is supplied, the signals X1' and $\overline{X1'}$ are outputted by two lines for each. The in-phase signals X1' is supplied to the signal lines 1 and 3, and the opposite phase signal $\overline{X1'}$ is supplied to the signal lines 2 and 4. The relation between the potentials of such signal lines 1~4 and the address signals X0 and X1 is explained below.

Consideration is made for the case where both the address input signals X0 and X1 are of ECL level low potentials (usually, when the maximum potential is to be Vcc=0 V, a high potential and a low potential of the input signal are assumed to be respectively $-1.6$ V and $-2.4$ V, and a reference voltage VR1 is assumed to be $-2.0$ V). As to the signal lines 1~4, as shown in FIG. 1, the emitter follower outputs of two paired signals each of the paired signals X0', $\overline{X0'}$ and X1', $\overline{X1'}$ are wired-OR connected. The signal X0' and X1' are of low potential and the signal $\overline{X0'}$ and $\overline{X1'}$ are of high potential. Consequently, only the signal line 3, to which the signals X0' and X1' are connected, is of low potential, and since at least one of the address buffer output signals X0', $\overline{X0'}$, X1' and $\overline{X1'}$ is of high potential, the other signal lines (1, 2 and 4) become high potential. That is, a selected signal line becomes low potential. In FIG. 1, the same is true in the relation between the input address signals X2, X3 and the signal lines 5~8, so that the selected one line among the signal lines 5~8 becomes low potential.

Next, the theory that one gate is selected by such signal lines 1~8 among the sixteen ECL gates b is explained. In the 2-input ECL gate b, an output becomes a logical NOR output. In FIG. 1, the bipolar transistor Q5 of the ECL gate b is connected with one line among the four signal lines 1~4, and the bipolar transistor Q6 is connected with one line among the four signal lines 5~8. The sixteen ECL gates b each having a first input terminal and a second input terminal are divided into four groups of the ECL gate groups b-1~b-4. For instance, to each of the first input terminals of the four 2-input ECL gates b in the ECL gate group b-1, the signals of the signal lines each selected from among the signal lines 1~4 in accordance with the address input signals X0 and X1, are inputted, respectively. And, to each of the second input terminals of the above four 2-input ECL gates b, the signal on the signal line 5 which is selected from among the signal lines 5~8 on the basis of the input signals X2 and X3 is commonly inputted. Likewise, the signal lines 1~4 are respectively connected to each of the first input terminals of the four ECL gates b included in the respective ECL gate groups b-2~b-4. The signal line 6 is commonly connected to the second input terminals of the four 2-input ECL gates b in the gate group b-2, the signal line 7 is commonly connected to the second input terminals of the four 2-input ECL gates b in the gate group b-3, and the signal line 8 is commonly connected to the second input terminals of the four 2-input ECL gates b in the gate group b-4. As described above, among the signal lines 1~4 only one signal line becomes low potential and among the signal line 5~8 only one signal line becomes low potential, and all the other remaining signal lines become high potential. As a result, by the signal lines 5~8, one gate group is selected from among the ECL gates groups b-1~b-4. For instance, when the signal line 5 is selected and is of low potential while other signal lines 6~8 are of high potential, all the ECL gates b other than those included in the ECL gate group b-1 output low potential. Since the signal line 5 is of low potential and is commonly connected to the four ECL gates b included in the gate group b-1, each of the output potentials of these four ECL gates b is decided by the potentials of the signal lines 1~4. Now, for instance, when the signal line 1 is selected and becomes low potential since X0 is high potential and X1 is low potential, only the terminal 11 among the output terminals of the ECL gates b becomes high potential and other output terminals 21, 31 and 41 become low potential. In this way, only one ECL gate is selected from among the sixteen ECL gates in accordance with a combination of the levels of the address input signals X0, X1, X2 and X3.

The foregoing has explained as to how the particular one ECL gate is selected by means of the wired-OR connection of the emitter follower outputs. Now, power consumption that comes a problem when the ECL gates are used is explained. In the CMOS and BiCMOS gates, a direct current does not flow under the steady-state output, so that no power is consumed therein. Therefore, in the case where the CMOS gates or the BiCMOS gates are used for a decoder circuit, the power consumption thereby is not necessary to be taken into consideration under the steady state. However, in the case of the ECL gate, a certain power on a constant current is consumed constantly irrespective of the output state of the ECL gate because the output is taken out by having the divided current of the constant current source flow into a pair of bipolar transistors (right and left in the drawings) forming the differential amplifier. Such consumption of current is very large when a decoder is constituted by the ECL gates. In the conventional decoder circuit shown in FIG. 1, for example, one of the ECL gates b alone consumes usually 0.5 mA of the constant current (the constant current circuit being composed of a bipolar transistor Q9 and a resistor R4). Since the number of the ECL gates b are sixteen, the decoder circuit in the part concerned consumes $0.5 \text{ mA} \times 16 = 8$ mA. In the actual 16K bit ECL RAM, the memory cell array is arranged, for instance, in a matrix form of $128 \times 128$, hence 256 ECL gates. Therefore, the consumption of power reaches even half the power consumption of the entire 16K bit ECL RAM and this has been a great problem to a high integration density of the semiconductor devices.

The decoder circuit using the conventional ECL gates as explained above involves large current consumption since a constant current continues to flow there regardless of the potential in the output terminal, that is, whether it is in a select state or a non-select state. Such a characteristic of the circuit has been one of the causes hindering a high density of integration of the semiconductor devices.

SUMMARY OF THE INVENTION

It is, therefore, a primary object of the invention to overcome the problems existing in the conventional circuit devices and to provide an improved integrated circuit device wherein the power consumption is effectively reduced even though the ECL gates are used therein.

According to one aspect of the invention, there is provided a semiconductor integrated circuit device which comprises:

an ECL gate group which includes a plurality of ECL gates each having a constant current source formed by a MOS transistor circuit and being for performing a predetermined logical operation; and a gate voltage control circuit which is commonly connected to the MOS transistor circuits of the plurality of ECL gates, which controls impedance of the MOS transistor circuits with two potential bias voltages being supplied to the gates of the MOS transistor circuits, and which produces a high potential bias voltage when a gate group selection signal inputted to the gate voltage control circuit indicates a selection state for the ECL gate group and produces a low potential voltage when the selection signal indicates a non-selection state.

For instance, for the ECL gates constituting the decoder circuit, the decode signal on the signal line under the non-selected state is amplified to the CMOS level by means of the level conversion circuit and, under the non-selected state, it is made possible for the gate voltage of the MOS transistor of the constant current source to be lowered by the ECL level decode signal converted to the CMOS level.

In the semiconductor integrated circuit device according to the invention, it becomes possible for the current consumption to be saved largely by the controlling of the impedance of the MOS transistor of the constant current source for the ECL gate, which is achieved through the lowering of the gate voltage of the MOS transistor in the constant current source for the ECL gate under the non-selected state at the decoder circuit of the ECL gate.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF PREFERRED EMBODIMENTS

Now, an explanation is made on embodiments according to the invention with reference to the appended drawings. It should be noted that, throughout the following explanation, similar reference symbols or numerals refer to the same or similar elements in all the figures of the drawings.

Figure 1:
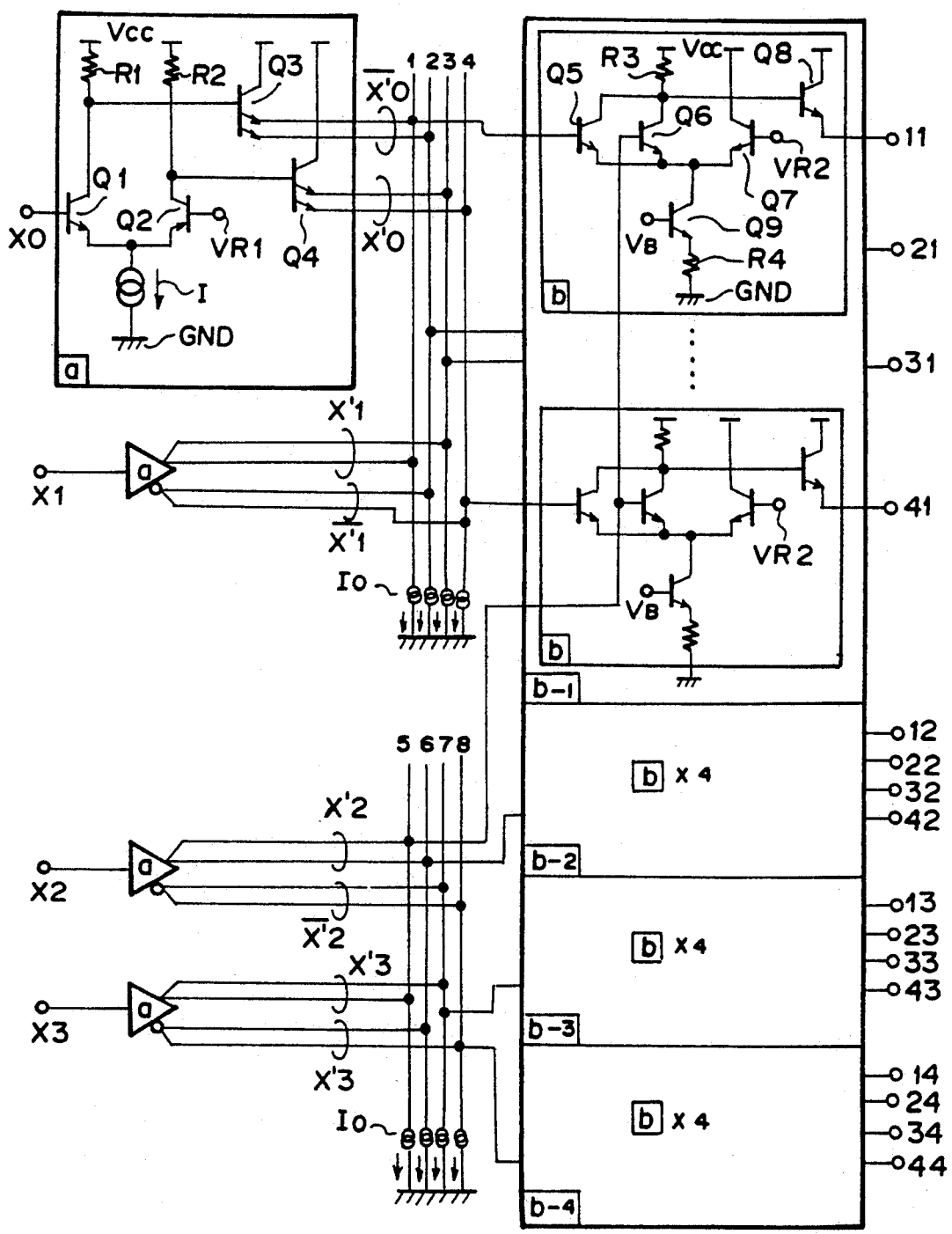
FIG. 1 is a circuit diagram showing the structure of an example of a conventional semiconductor integrated circuit device using ECL gates.
Figure 2:
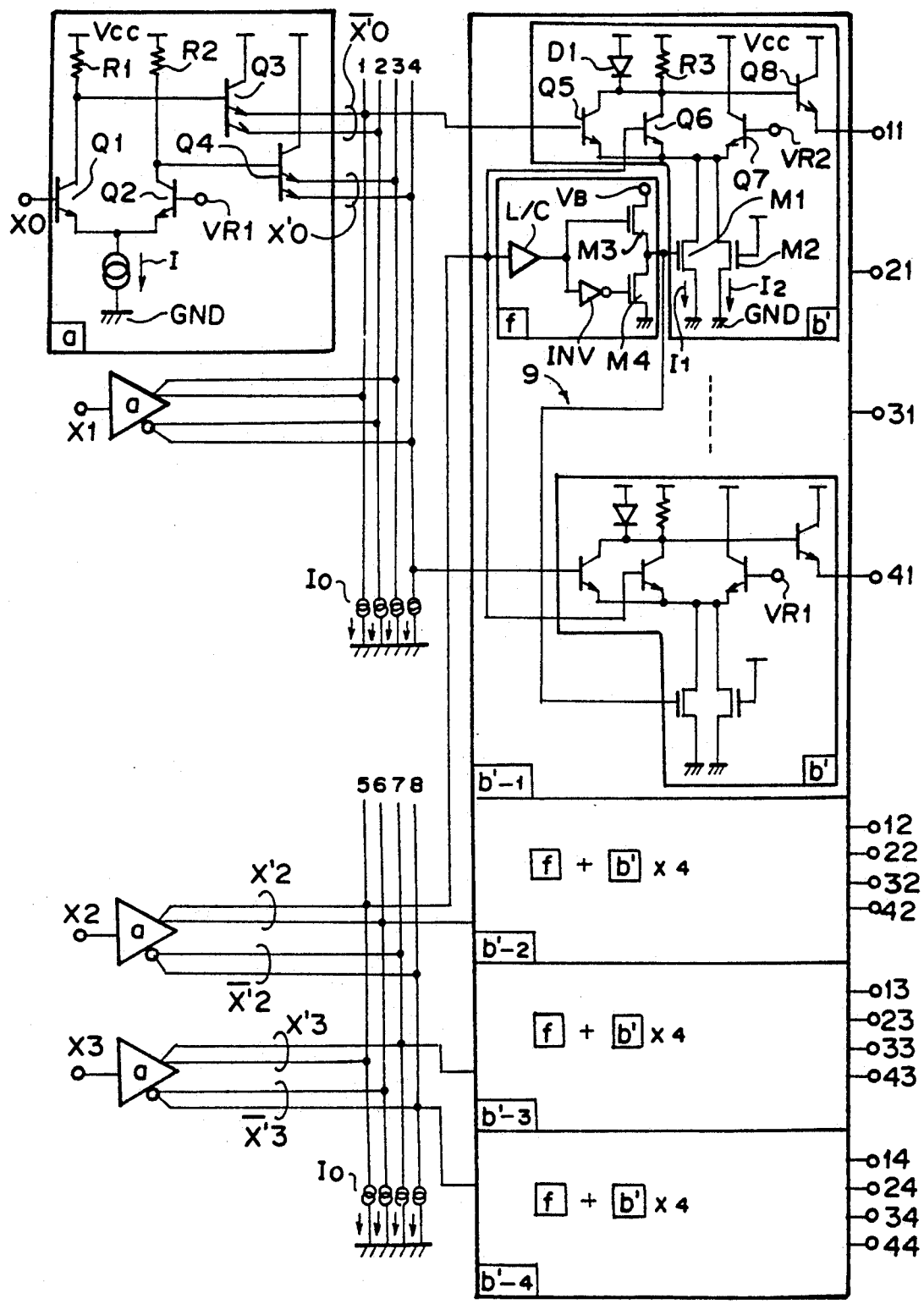
FIG. 2 is a circuit diagram showing the structure of a semiconductor integrated circuit device of a first embodiment according to the invention.

FIG. 2 is a block diagram showing a circuit arrangement of a semiconductor integrated circuit device of a first embodiment according to the invention. Address buffers a which receive address input signals X0, X1, X2 and X3, respectively, are the same as the address buffers in the conventional example shown in FIG. 1. The selection of the signal lines 1~8 is also effected in the same manner as that in the conventional example shown in FIG. 1. Unlike in the conventional ECL gate b shown in FIG. 1, each of the ECL gates b' shown in FIG. 2 uses n-channel MOS transistors (hereinafter referred to as "nMOS transistors") M1 and M2 as the constant current source, and further adopts additionally a diode D1 for clamping the output level. A gate voltage control circuit f, which includes a level conversion circuit L/C and a CMOS inverter INV, converts the signals of ECL level such as the address buffer outputs X0' and $\overline{X0'}$ to the signals of CMOS level, and then switches the gate voltage of the nMOS transistor M1 which constitutes the constant current source to either level of the potential $V_B$ and the ground potential GND. The gate voltage control circuit f is provided for each ECL gate groups b'-1, b'-2, b'-3 and b'-4.

Now, an explanation is made on the specific circuit shown in FIG. 2. Attention is directed to the four ECL gates b' which are included in the ECL gate group b'-1. It is now assumed that the ECL gate group b'-1 is selected from among the ECL gate groups b'-1~b'-4 in accordance with the address input signals X2 and X3. The signal line 5 outputs the low potential (−1.6 V) of ECL level and turns off the bipolar transistor Q6 in each of the four ECL gates b' included in the ECL gate group b'-1. Further, the signal lines 1~4 are connected respectively to the four first input terminals of the ECL gates b', and if the signal line 1 is of low potential, the other remaining signal lines 2~4 are of high potential and, consequently, the particular ECL gate b' which is connected to the output terminal 11 is selected and outputs a high potential to the output terminal 11. At this time, the gate voltage control circuit f including the level conversion circuit L/C and the CMOS inverter INV receives the low potential of ECL level on the signal line 5 and inverts the potential to the high potential (Vcc level) of CMOS level, whereby an nMOS transistor M3 is turned on and an nMOS transistor M4 is turned off through the CMOS inverter INV. As the nMOS transistor M3 is connected to a bias voltage source $V_B$, the bias voltage $V_B$ appearing on a signal line 9 through the on-state nMOS transistor M3 is applied to the gate of the nMOS transistor M1 of the constant current source, thereby allowing a constant current $I_1$ to flow in the nMOS transistor M1. Since the same potential is supplied also to the remaining three ECL gates b' included in the ECL gate group b'-1 by the signal line 9, the constant current $I_1$ is allowed to flow in each of the four ECL gates. If the value of the constant current $I_1$ is assumed to be of 0.5 mA as in the conventional example, the total current that is consumed in the ECL gate group b'-1 is calculated as $4 \times I_1 = 4 \times 0.5$ mA $= 2$ mA. Since, in the other remaining ECL gate groups b'-2~b'-4, the signal lines 6~8 are of high potential (−0.8 V) of ECL level, the nMOS transistors M3 and M4 that are included in the gate voltage control circuit f in each gate group, turn off and on, respectively, causing the gate voltage in the nMOS transistor M1 for a constant current source to be lowered to the ground potential GND, and a constant current of the ECL gate b' becomes a current $I_2$ which is determined by the other nMOS transistor M2. The value of such current $I_2$ suffices with the current value that is enough for the ECL gates b' included in each of the ECL gate groups b'-2~b'-4 to keep the output under the non-selected state. For instance, the value in the order of 10 µA is sufficient for the purpose. As a result, each of the twelve non-selected gates among the sixteen ECL gates b' in the total consumes merely about $I_2 = 10$ µA of current. Finally, the consumption of current is calculated as $0.5$ mA$\times 4 + 10$ µA$\times 12 = 2.12$ mA as a whole in the sixteen ECL gates b'. As compared with the conventional example shown in FIG. 1 in which the current consumption is 0.5 mA$\times 16 = 8$ mA as explained above, the current consumption in the decoder portion according to the invention is reduced to 27% of the conventional example.

Figure 3:
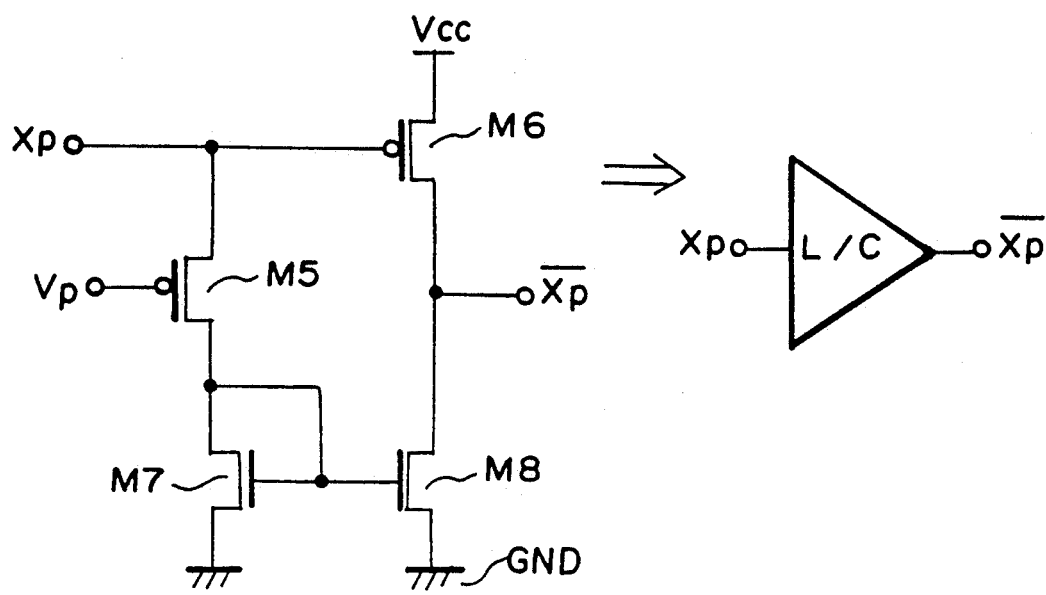
FIG. 3 is a circuit diagram showing the specific structure of a level conversion circuit used in the first embodiment of the invention.
Figure 4:
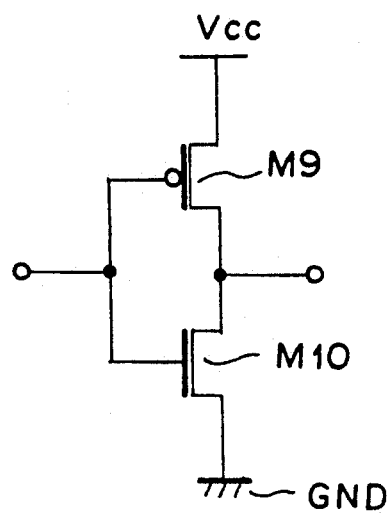
FIG. 4 is a circuit diagram showing the specific structure of a CMOS inverter circuit used in the first embodiment of the invention.

The conversion circuit L/C which is included in the gate voltage control circuit f and converts the signal of ECL level to that of CMOS level can be composed, as shown in FIG. 3, of the circuits that use the p-channel MOS transistors M5, M6 and nMOS transistors M7, M8. The level conversion circuit L/C, shown in FIG. 3, outputs the signal $\overline{Xp}$ by inverting the signal Xp that is inputted. The CMOS inverter INV, as shown in FIG. 4, may be composed of a complementary pair of a pMOS transistor M9 and an nMOS transistor M10.

Next, a second embodiment according to the present invention is explained.

Figure 5:
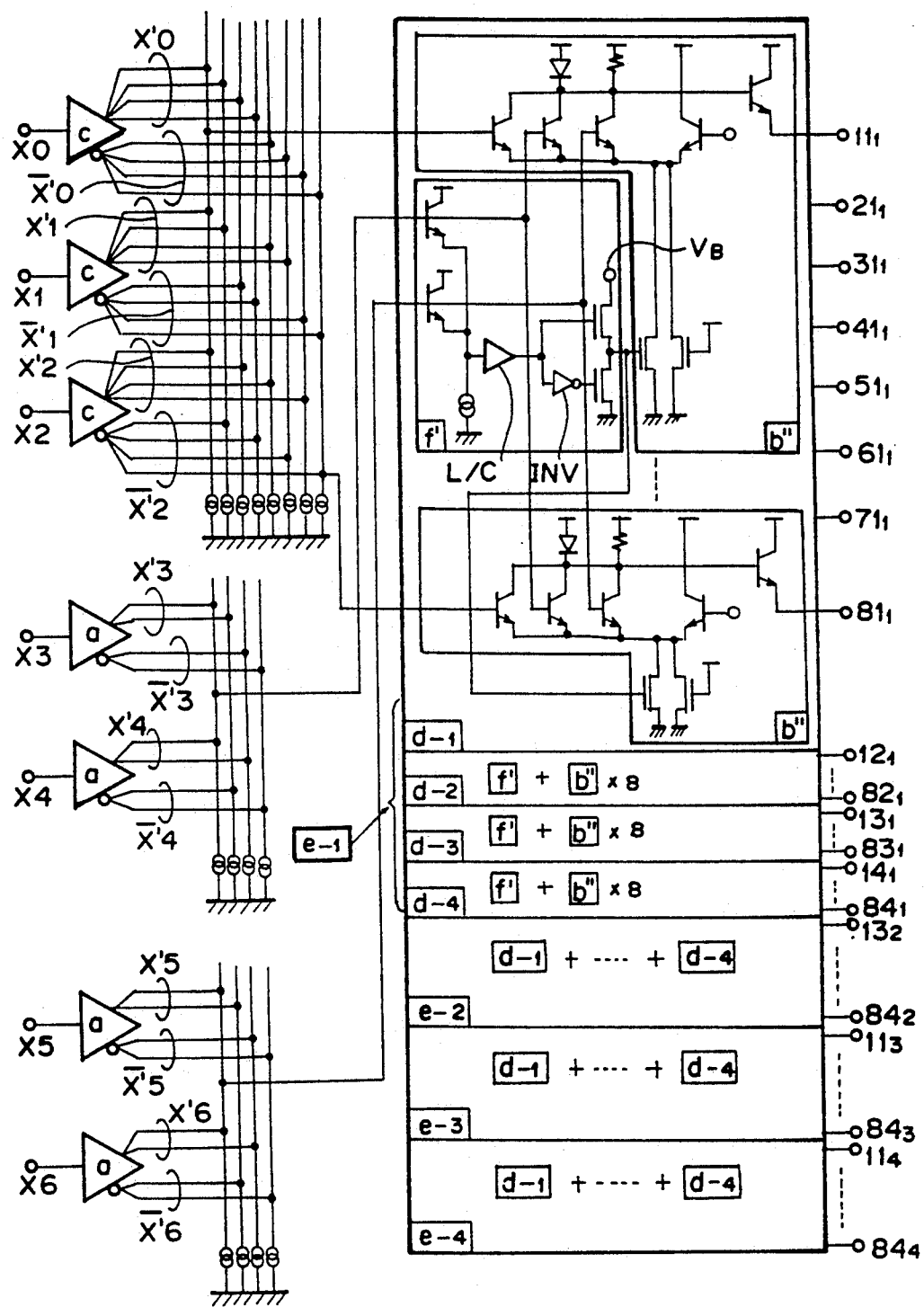
FIG. 5 is a circuit diagram showing the structure of a semiconductor integrated circuit device of a second embodiment according to the invention.

FIG. 5 is a block diagram showing the structure of a semiconductor integrated circuit device of the second embodiment according to the invention.

The ECL gate b'' is a gate which performs a three-input logical NOR operation. The ECL gate groups d-1~d-4 comprise respectively the eight ECL gates b'' and one gate voltage control circuit f', and the eight ECL gates b'' are selected by the address input signals X0~X2. The ECL gate groups e-1~e-4 comprise respectively the four ECL gate groups d-1~d-4, and the four ECL gate groups d-1~d-4 are selected by the address input signals X3 and X4. Further, the four ECL gate groups e-1~e-4 are selected by the address input signals X5 and X6. The gate voltage control circuit f' that controls the constant current source of the basic ECL gate b'' and, more specifically, that controls the gate voltage of the nMOS transistor concerned is substantially the same as that in the above first embodiment.

Now, an explanation on the operation of the semiconductor integrated circuit device of the second embodiment is made in detail.

The individual ECL gate b'' is a three-input NOR gate and, eight of such ECL gates b'' form the ECL gate group d-1. To the ECL gates b'' included in such ECL gate group d-1, the selection signals from the address input signals X3 and X4 and the selection signals from the address input signals X5 and X6 are inputted. Further, the selection of one ECL gate from among the eight ECL gates b'' is decided by the selection signals from the address input signals X0, X1 and X2. The difference of such arrangement from that of the first embodiment is that the gate voltage control circuit f' receives the two decoder signals of ECL levels and controls the gate potential of the nMOS transistor of the constant current source. In this second embodiment, the circuit has sixteen ECL gate groups each being the same as that of the ECL gate group d-1, and fifteen of these ECL gate groups are in the non-selected state. Therefore, the ECL gate b'' consumes the current merely about 10 μA of constant current. Compared with the conventional circuit of the ECL decoder that consumes 0.5 mA×128=64 mA, the current consumption by the circuit according to the second embodiment of the invention is 0.5 mA×8+10 μA×120 =5.2 mA, thereby realizing a large reduction in the current consumption.

Figure 6:
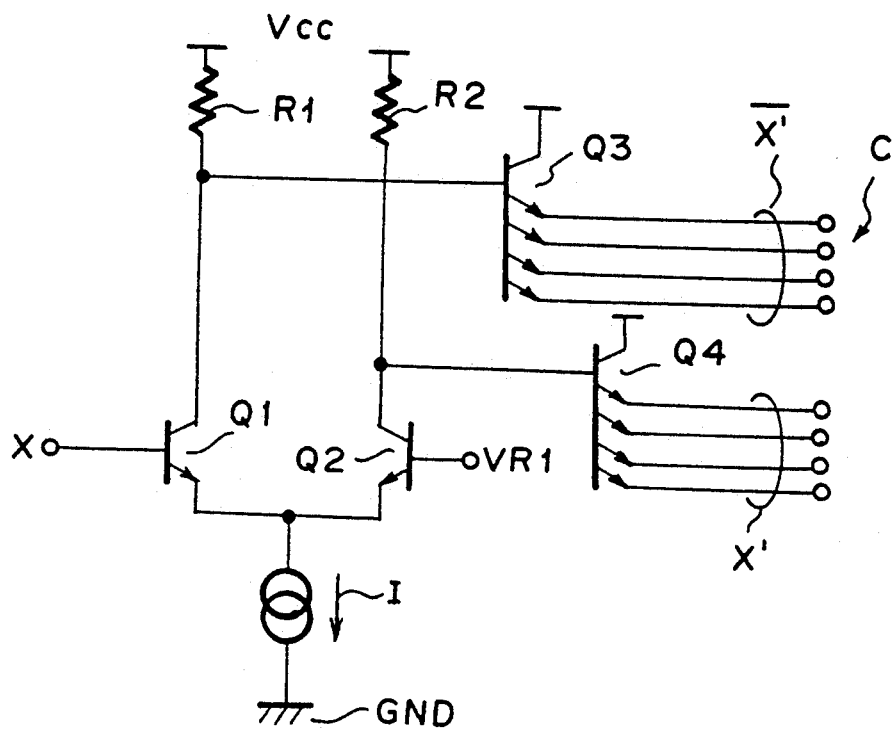
FIG. 6 is a circuit diagram showing the specific structure of a 4-output ECL circuit used in the second embodiment of the invention.
Figure 7:
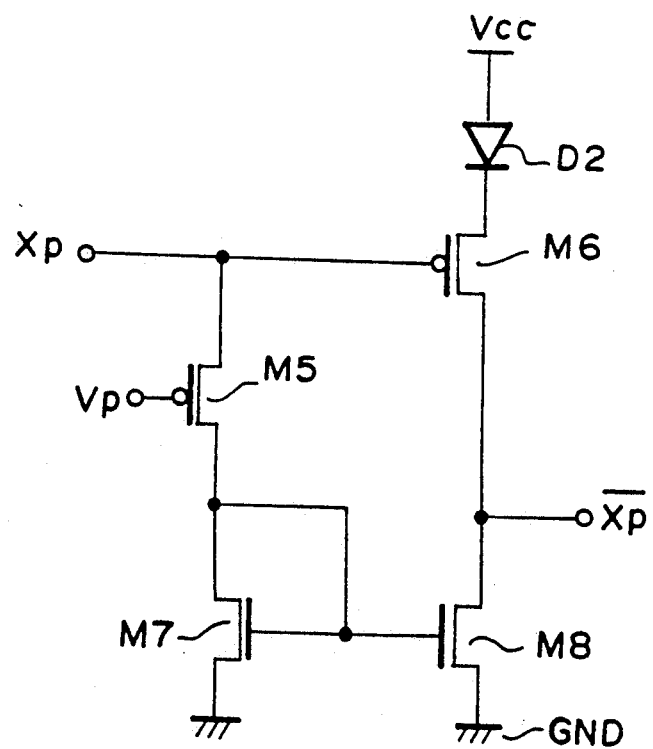
FIG. 7 is a circuit diagram showing the specific structure of a level conversion circuit used in the second embodiment of the invention.
Figure 8:
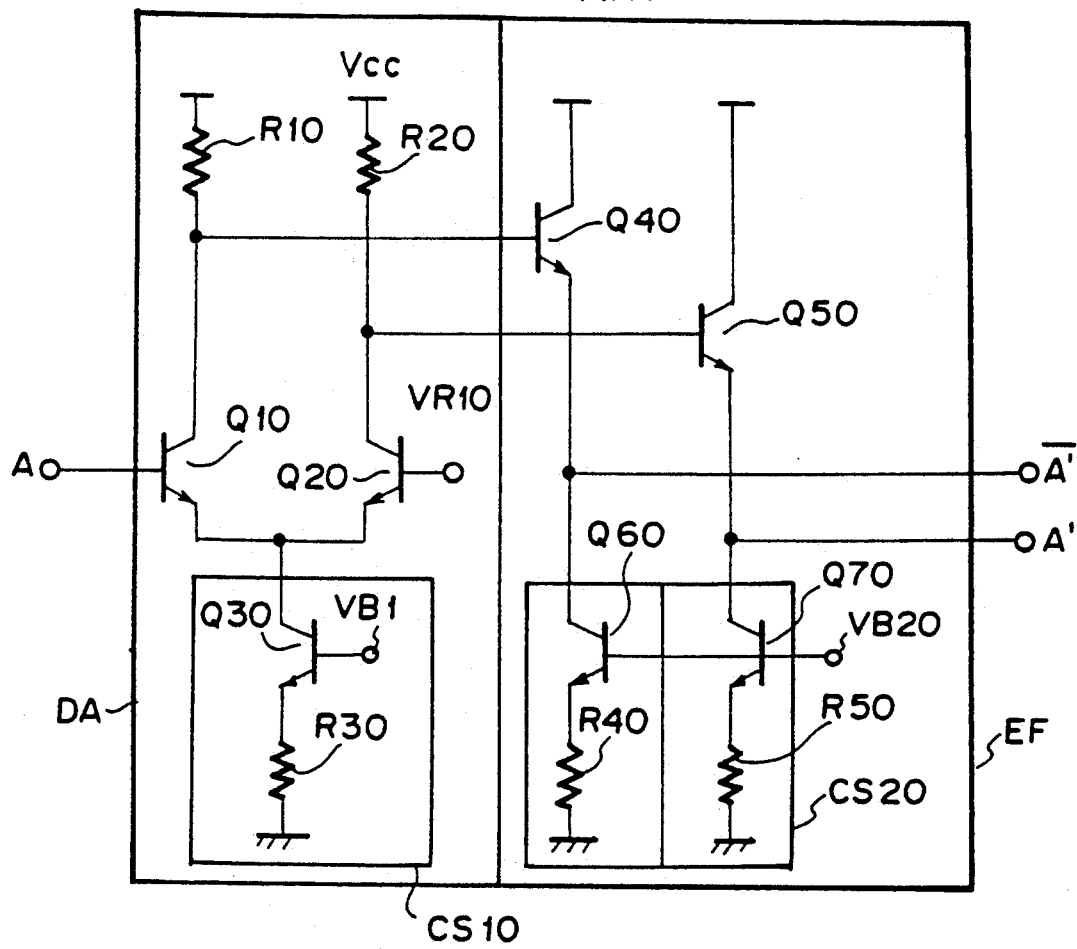
FIG. 8 is a circuit diagram showing the structure of a typical basic ECL circuit.

In the second embodiment explained above, as an address buffer which receives each of the address input signals X0, X1 and X2, respectively, there is provided a 4-output address buffer c which outputs four each of output signals X' and X' with respect to the input signal X inputted thereto. As such address buffer c having four outputs, a 4-output ECL circuit is used, which comprises, as shown in FIG. 6, the bipolar transistors Q1, Q2, the bipolar transistors Q3, Q4 which have multi-emitter configuration, the load resistors R1, R2, and the constant current source I. As the level conversion circuit L/C, that converts the input signal of ECL level to the output signal of CMOS level, the circuit, as shown in FIG. 7, having a diode D2 in addition to the circuit of FIG. 3 can be used.

As explained above, according to the present invention, it is possible to provide a semiconductor integrated circuit device which is capable of largely saving the consumption of current by controlling the impedance of the MOS transistors of the constant current sources of the ECL gates.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor integrated circuit device comprising:
    an ECL gate group receiving input signals and including a plurality of ECL gates each having a constant current source formed by a MOS transistor circuit and performing a predetermined logical operation on said input signals; and
    a gate voltage control circuit which is commonly connected to said MOS transistor circuits of said plurality of ECL gates for controlling impedance of said MOS transistor circuits with two potential bias voltages being supplied to gates of said MOS transistor circuits and producing a high potential bias voltage when a gate group selection signal inputted to said gate voltage control circuit indicates a selection state for said ECL gate group and producing a low potential bias voltage when said gate group selection signal indicates a non-selection state, wherein
    said gate voltage control circuit comprises a level conversion circuit receiving said gate group selection signal of ECL level and converting it into a signal of CMOS level, a CMOS inverter circuit receiving said CMOS level signal outputted from said level conversion circuit, a first nMOS transistor having a drain connected to a bias voltage source and a gate receiving said CMOS level signal outputted from said level conversion circuit, and a second nMOS transistor having a source grounded, a gate connected to an output node of said CMOS inverter circuit, and a drain connected to a source of said first nMOS transistor thereby forming an output node connected to the gates of said MOS transistor circuits.

2. A semiconductor integrated circuit device according to claim 1, in which said CMOS inverter circuit comprises a complementary pair of pMOS transistor and nMOS transistor, said pMOS transistor having a source connected to a power source, a gate connected to an input node of said inverter circuit, and a drain connected to an output node thereof, and said nMOS transistor having a source grounded, a gate connected to the input node and a drain connected to the output node.

3. A semiconductor integrated circuit device comprising:
    an ECL gate group receiving input signals and including a plurality of ECL gates each having a constant current source formed by a MOS transistor circuit and performing a predetermined logical operation on said input signals; and
    a gate voltage control circuit which is commonly connected to said MOS transistor circuits of said plurality of ECL gates for controlling impedance of said MOS transistor circuits with two potential bias voltages being supplied to gates of said MOS transistor circuits and producing a high potential bias voltage when a gate group selection signal inputted to said gate voltage control circuit indicates a selection state for said ECL gate group and producing a low potential bias voltage when said gate group selection signal indicates a non-selection state, wherein
    said MOS transistor circuit forming the constant current source comprises a first nMOS transistor having a gate receiving said low and high potential bias voltage from said gate voltage control circuit, a source grounded and a drain, and a second nMOS transistor having a source grounded, a drain connected to the drain of said first nMOS transistor and a gate receiving a predetermined bias voltage whose value is sufficient for said ECL gate to hold the output under the non-selected state.

4. A semiconductor integrated circuit device comprising:
    a plurality of ECL gate groups each receiving input signals and including a plurality of ECL gates each having a constant current source formed by a MOS transistor circuit and performing a predetermined logical operation on said input signals; and
    a plurality of gate voltage control circuits each provided in each of said ECL gate groups and each being commonly connected to said MOS transistor circuits of said plurality of ECL gates, each gate voltage control circuit controlling impedance of said MOS transistor circuits with two potential bias voltages being supplied to gates of said MOS transistor circuits and producing a high potential bias voltage when a gate group selection signal applied to said gate voltage control circuit indicates a selection state for said ECL gate group and producing a low potential bias voltage when said gate group selection signal indicates a non-selection state.

5. A semiconductor integrated circuit device according to claim 4, in which each of said gate voltage control circuit receives a first and a second gate group selection signal and each of said ECL gates has three input terminals and performs 3-input logical NOR operation.

* * * * *